United States Patent [19]

Yamagishi et al.

[11] Patent Number: 4,713,759
[45] Date of Patent: Dec. 15, 1987

[54] MEMORY BANK SWITCHING APPARATUS

[75] Inventors: Hideaki Yamagishi; Tetsuro Oshimi, both of Kanagawa, Japan

[73] Assignee: Mitsubishi Denki Kabushiki Kaisha, Tokyo, Japan

[21] Appl. No.: 695,252

[22] Filed: Jan. 25, 1985

[30] Foreign Application Priority Data

Jan. 27, 1984 [JP] Japan .................................. 59-12993

[51] Int. Cl.[4] .............................................. G06F 12/06
[52] U.S. Cl. ...................................................... 364/200
[58] Field of Search ... 364/200 MS File, 900 MS File

[56] References Cited

U.S. PATENT DOCUMENTS 3,737,860  6/1973  Sporer .................................. 364/200
4,118,773 10/1978  Raguin et al. ....................... 364/200
4,156,928  5/1979  Inose et al. ......................... 364/900
4,368,515  1/1983  Neilsen .............................. 364/200

Primary Examiner—Thomas M. Heckler
Attorney, Agent, or Firm—Bernard, Rothwell & Brown

[57] ABSTRACT

A memory bank switching apparatus equipped with a bank switching register, wherein a specific address signal within a prescribed address scope for access to ROMs is outputted onto an address bus, and data relative to the address of a memory bank to be used subsequently is outputted onto a data bus, so that a location in the bank switching register is selected by the address signal. Then the data on the data bus is written in the bank switching register, thereby enabling only the memory bank selected according to the content of the bank switching register.

3 Claims, 3 Drawing Figures

MEMORY BANK SWITCHING APPARATUS

BACKGROUND OF THE INVENTION

1. Field of the Invention

The present invention relates to a memory bank switching apparatus and, more particularly, to an apparatus for use in selection of a desired one of memory banks consisting of read-only memories (ROM) where mutually different programs are stored.

2. Description of the Prior Art

The total number of data storable in a main memory unit is determined by the number of bits of address signals. For example, when each address signal is composed of 14 bits in a case where data are accessed per byte (8 bits) thereof by individually different address signals, a total of $2^{14}$ (approx. 16,000) bytes are stored in the main memory unit and any desired byte can be accessed. In a main memory unit so constituted that 12,000 bytes out of its storage capacity of 16,000 bytes are allocated to three RAM memory banks each having a 4,000-byte storage capacity while the remaining 4,000 bytes are allocated to one ROM memory bank having a 4,000 byte storage capacity, then it becomes possible to access a desired byte in the main memory unit by a 14-bit address signal.

However, in the example mentioned above, there may arise an instance where two ROM banks each having a 4,000-byte storage capacity need to be additionally provided in view of programs to be stored in the ROMs. In such a case, it is impossible, by a 14-bit address signal alone, to access desired data out of a total of 24,000 bytes in the RAMs and ROMs. And therefore a memory bank switching apparatus is required for selectively using merely one of the three ROM memory banks.

In the conventional method of switching memory banks, it has been customary to control a switching apparatus by the application of a signal which is used for switching input/output (I/O) units connected to a computer system. Normally the computer system is equipped with a plurality of I/O units for which channel addresses are predetermined respectively. And when connection to a desired I/O unit is requested from a central processing unit (CPU), a signal of the channel address relative to such I/O unit is transmitted to connect the same to an address bus and a data bus. In the prior art, the operation of switching the memory banks has been performed heretofore in a manner similar to the above.

According to such conventional method, it is necessary to first output from the CPU a signal to discriminate between a channel address signal for selecting a desired I/O unit and a signal for specifying a desired memory bank, and then to output a data address signal. Thus, the signals to be outputted from the CPU for switching the memory banks become great in number, and there exists another unavoidable disadvantage that the hardware configuration of the switching apparatus is rendered considerably complicated to eventually bring about an increase of the production cost.

SUMMARY OF THE INVENTION

The present invention has been accomplished in an attempt to eliminate such disadvantages observed in the prior apparatus. And its object resides in providing an improved memory bank switching apparatus equipped with a bank switching register, wherein a specific address signal within a prescribed address scope for access to a ROM is outputted to an address bus, and data relative to the address of a memory bank to be used subsequently is outputted to a data bus, so that a location in the bank switching register is selected by the address signal. Then the data on the data bus is written in the bank switching register, thereby enabling only the memory bank selected according to the content of the bank switching register.

Other objects of the present invention and advantages thereof will become apparent from the detailed description that will be given below with reference to an exemplary embodiment shown in the accompanying drawings.

DETAILED DESCRIPTION OF THE PREFERRED EMBODIMENT

Figure 1:
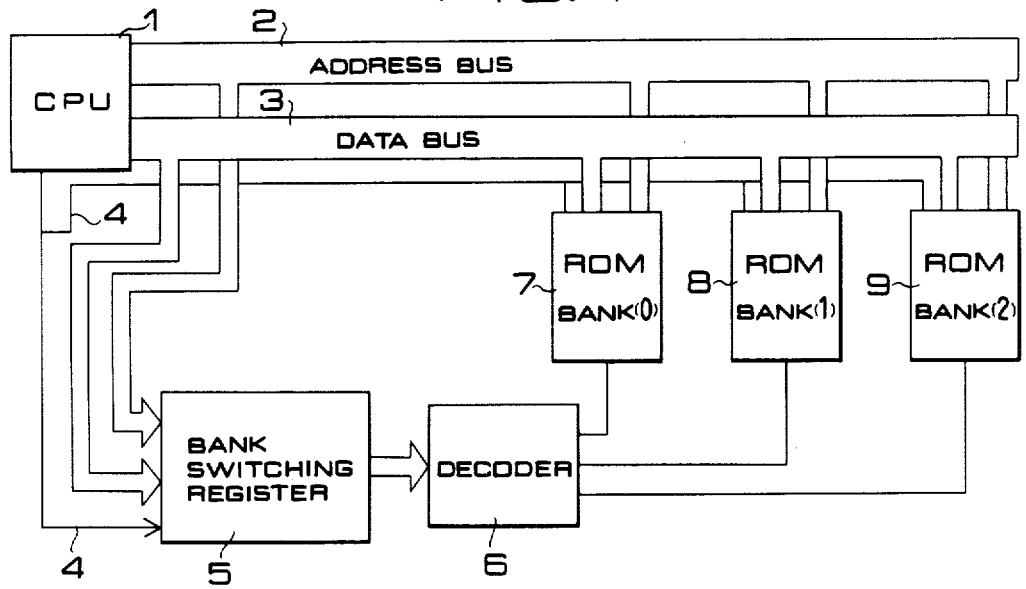
FIG. 1 is a block diagram of an exemplary switching apparatus embodying the present invention.

Hereinafter a preferred embodiment of the present invention will be described with reference to the accompanying drawings. In the block diagram of FIG. 1 showing an exemplary apparatus of this invention, there are included a CPU 1, an address bus 2, a data bus 3, a control signal line 4 to which a command signal is outputted, a bank switching register 5, a decoder 6, and ROM banks 7, 8 and 9. For the convenience of explanation, it is assumed here that each of the ROM banks has $2^{12}$ data and is accessed by $2^{12}$ kinds of address signals ranging from X [3000] to X [3FFF] out of entire address signals composed of $2^{14}$ bits, in which X [ ] denotes hexadecimal notation. And the RAM is accessed by the address signals ranging from X [0000] to X [2FFF].

The address signals are inputted in parallel to the entire ROM banks 7, 8 and 9 from the address bus 2. In this arrangement, merely the ROM bank fed with a logic "1" signal from the decoder 6 is in an enabled state.

When a specific address signal within a prescribed address signal scope for access to the ROM is outputted onto the address bus 2, writing in the bank switching register 5 is enabled. And when a command signal on the control signal line 4 instructs writing control, the data on the data bus 3 is written in the bank switching register 5. The address signal, the data and the command signal inputted to the bank switching register 5 are also inputted to the ROM bank. However, since writing in the ROM is impossible due to the characteristics thereof, the content therein remains unchanged.

Figure 2:
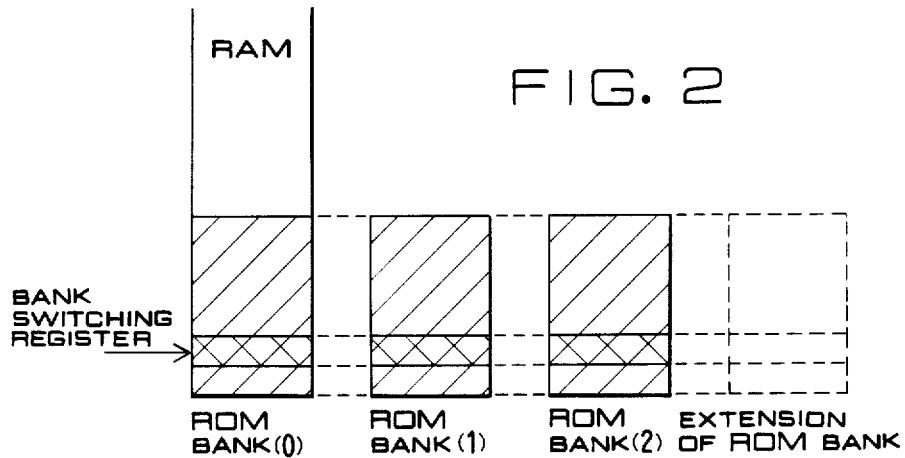
FIG. 2 shows an address scope for access to ROM banks in FIG. 1.

FIG. 2 shows an address scope for access to the ROM banks, wherein the same address signal is fed to the entire ROM banks, and a specific address for writing the data in the bank switching register 5 is within the prescribed address scope for access to the ROM bank.

Figure 3:
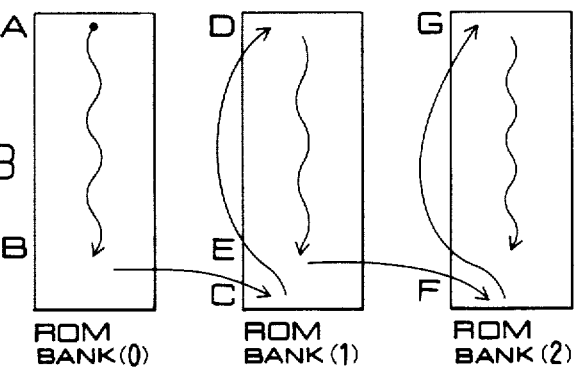
FIG. 3 illustrates the operation performed in the apparatus of FIG. 1.

FIG. 3 illustrates the operation performed in the apparatus of FIG. 1. Supposing now that the bank switching register 5 is reset in the stage of initialization, a signal for enabling the ROM bank (0) 7 is outputted from the decoder 6, and the program in the ROM bank (0) 7 is read out sequentially from an address A. And then the program this read out is executed sequentially.

Upon arrival of such execution at an address B which is a specific one, a numerical value 1 is written in the bank switching register 5 to enable the ROM bank (1) 8, so that the program now reads out sequentially from the address B in the ROM bank (1) 8 and executes sequentially to address C. The operation then jumps to an address D in response to a command read out at the address C, and the program read out sequentially from the address D is executed sequentially. Upon arrival of such execution at an address E which is also a specific one as the foregoing address B, a numerical value 2 is written in the bank switching register 5 to enable the ROM bank (2) 9, whereby the program reads out sequentially from the next instruction following address E in the ROM bank (2) 9 and executes sequentially to address F. Then the operation jumps to the address G in response to a command read out at an address F, and the program read out sequentially from the address G is executed sequentially.

Thus, by the address signals for accessing the data of $2^{12}$ bytes, it is rendered possible to access the data of $3 \times 12^{12}$ bytes as shown in FIG. 3, and further extension of the ROM banks can be carried out by increasing the number of ROM banks as shown in FIG. 2.

Although the present invention has been described hereinabove in connection with an exemplary constitution and exemplary numerical values, it is to be understood that the invention can be freely modified with respect to the kind (ROM or RAM) of the memory banks as well as the sizes and positions thereof. And the capacities of both the bank switching register 5 and the decoder 6 can be determined in accordance with the number of banks.

Furthermore, the program used for writing data in the bank switching register may be existent in either the RAM or the ROM.

Thus, according to the present invention, switching the memory banks can be carried out with a simplified hardware constitution, hence ensuring remarkable advantages in reducing the production cost of a computer.

What is claimed is:

1. A memory bank switching apparatus comprising: an address bus, a data bus and a control line; a plurality of memory banks consisting of ROMs and storing mutually different programs therein connected in parallel to said address bus, said data bus and said control line; a CPU for feeding an address signal to said address bus and a write control signal to said control line and for transmitting and receiving a data signal over said data bus; and a bank switching register connected to said CPU through said address bus, said data bus and said control signal line; said bank switching register, when addressed by said address bus, being responsive to the write control signal for storing therein a number corresponding to a selected one of said memory banks from said data bus; and said bank switching register being connected to said memory banks for enabling the selected memory bank and for disabling the non-selected memory bank or banks.

2. The memory bank switching apparatus as defined in claim 1, further comprising a decoder inserted between said bank switching register and each of said memory banks for decoding the content of said bank switching register and feeding a control signal to one of said memory banks selected according to the content of said register so as to effect access to said selected memory bank.

3. In an apparatus for switching a plurality of memory banks connected in parallel to an address bus, a data bus and a control line by first addressing said banks simultaneously by an address signal on the address bus and then applying a switching signal to the memory banks to select one of said memory banks alone, the improvement comprising: (a) a bank switching register connected to said address bus, said data bus and said control line for storing the numbers of said memory banks to effect access thereto; (b) means for outputting onto the address bus a specific address signal within a prescribed address scope for access to both said memory banks and said bank switching register, then outputting onto the data bus bank selecting data to be written in said bank switching register, and further outputting a write command onto the control signal line extending to said bank switching register; and (c) a decoder connected between said bank switching register and said memory banks for decoding the content of said bank switching register and transmitting a control signal to one of said memory banks selected according to said content so as to effect access thereto.

* * * * *

UNITED STATES PATENT AND TRADEMARK OFFICE
CERTIFICATE OF CORRECTION

PATENT NO. : 4,713,759

DATED : December 15, 1987

INVENTOR(S) : Hideaki Yamagishi et al.

It is certified that error appears in the above-identified patent and that said Letters Patent is hereby corrected as shown below:

Column 3, line 5, before "address" insert --next instruction following--.

Signed and Sealed this

Ninth Day of August, 1988

Attest:

DONALD J. QUIGG

*Attesting Officer*          *Commissioner of Patents and Trademarks*